United States Patent [19]
Glenn et al.

[11] Patent Number: 5,672,909
[45] Date of Patent: Sep. 30, 1997

[54] INTERDIGITATED WIREBOND PROGRAMMABLE FIXED VOLTAGE PLANES

[75] Inventors: Thomas P. Glenn, Gilbert; Ronald J. Molnar, Phoenix, both of Ariz.; Roy Dale Hollaway, Paranaque, Philippines

[73] Assignee: Amkor Electronics, Inc., Chandler, Ariz.

[21] Appl. No.: 688,083

[22] Filed: Jul. 29, 1996

Related U.S. Application Data

[63] Continuation of Ser. No. 385,024, Feb. 7, 1995, abandoned.

[51] Int. Cl.$^6$ .................................................. H01L 23/28
[52] U.S. Cl. ........................... 257/668; 257/692; 257/700; 361/794; 361/792
[58] Field of Search ........................... 257/691, 692, 257/773, 700; 361/794, 792

[56] References Cited

U.S. PATENT DOCUMENTS

| | | | |
|---|---|---|---|
| 4,410,905 | 10/1983 | Grabbe | 257/703 |
| 4,839,717 | 6/1989 | Phy et al. | 257/700 |
| 5,008,734 | 4/1991 | Dutta et al. | 257/700 |
| 5,173,767 | 12/1992 | Lange et al. | 257/700 |
| 5,225,709 | 7/1993 | Nishiuma et al. | 257/692 |
| 5,294,751 | 3/1994 | Kamada | 257/659 |
| 5,329,156 | 7/1994 | Bartlow | 257/773 |
| 5,343,074 | 8/1994 | Higgins, III et al. | 237/668 |
| 5,402,318 | 3/1995 | Otsuka et al. | 257/691 |
| 5,457,340 | 10/1995 | Templeton, Jr. et al. | 257/666 |
| 5,497,031 | 3/1996 | Kozono | 257/700 |

FOREIGN PATENT DOCUMENTS

| | | | |
|---|---|---|---|
| 0032252 | 2/1992 | Japan | 257/691 |
| 0085154 | 3/1994 | Japan | 257/691 |

Primary Examiner—Tom Thomas
Assistant Examiner—David B. Hardy
Attorney, Agent, or Firm—Skjerven, Morrill, MacPherson, Franklin & Friel LLP

[57] ABSTRACT

Two interdigitated comb-shaped fixed voltage buses such as a power bus and ground bus, in the form of metallization are provided substantially encircling of an integrated circuit die in an integrated circuit package or other integrated die assembly. Any selection of bonding pads on the die and metallization leads in the assembly may be connected to the fingers of either bus. The length of wire bond or TAB connections and the area occupied by the buses is minimized by the interdigitated geometry of the buses.

6 Claims, 5 Drawing Sheets

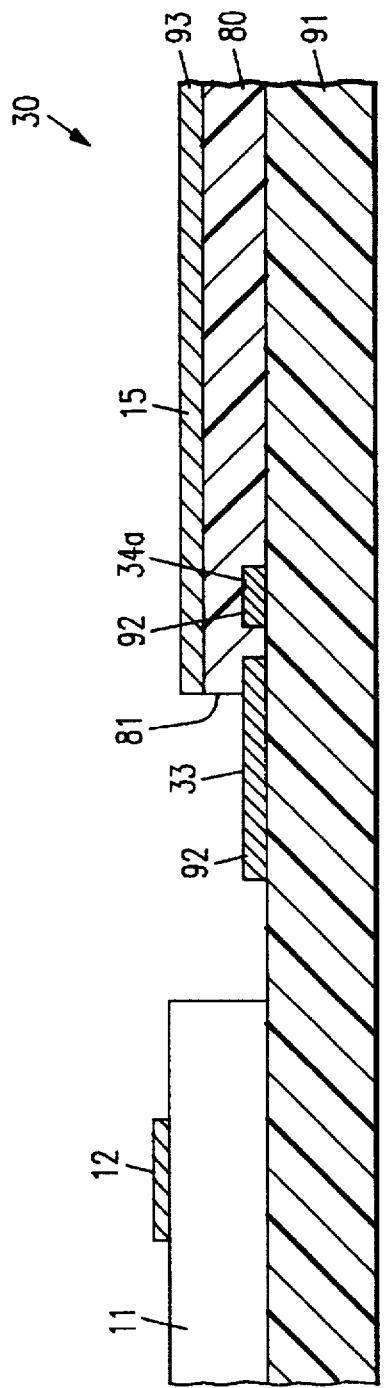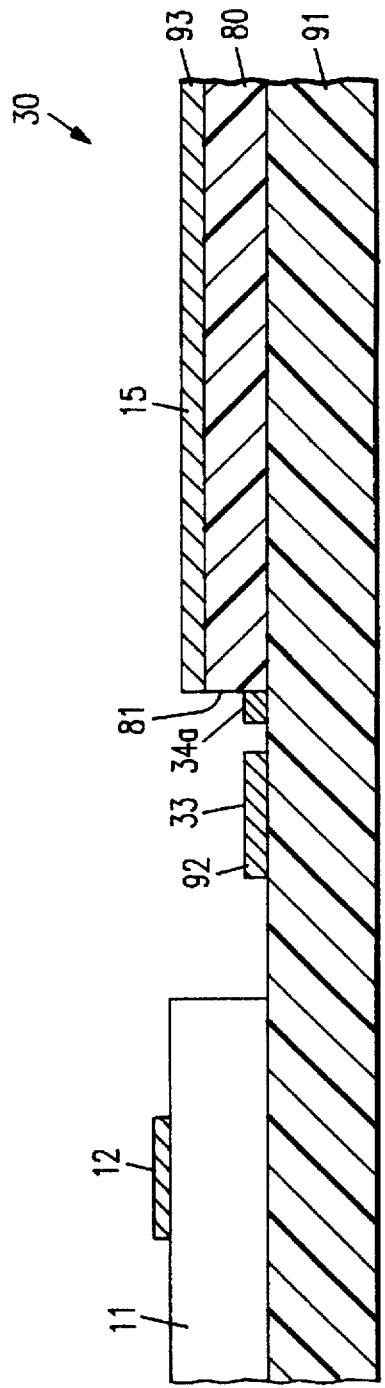

INTERDIGITATED WIREBOND PROGRAMMABLE FIXED VOLTAGE PLANES

This application is a continuation of application Ser. No. 08/385,024, filed Feb. 7, 1995, now abandoned.

FIELD OF THE INVENTION

This invention relates to the field of integrated circuits and particularly relates to fixed voltage buses located around integrated circuit die locations within integrated circuit packages, within multi-chip modules, or within other integrated circuit die assemblies.

BACKGROUND OF THE INVENTION

The area in which a die is located in an integrated circuit package, multi-chip module, or other integrated circuit assembly includes a die attach area and, laterally surrounding the die attach area, an interconnect area. In the interconnect area, a number of conductive leads, radiating away from the die attach area, are provided. After an integrated circuit die is attached to the die attach area, electric terminals or bond pads on the die are connected to the leads in the interconnect area. The connections are made by one of various methods of attaching wires or by the tape automated bonding (TAB) method. The connecting wires or TAB connections are made as short as possible to avoid excessive inductance, to obtain high test yield, and to minimize package size. The connecting wires or TAB connections are made short by locating the pads and leads close to the outer edge of the die.

The number of leads may equal or exceed the number of pads and each pad may be connected to its own unique lead. Alternatively, a fixed voltage bus may be provided close to the die and multiple pads and or leads may be connected to the bus. For example, a complex integrated circuit may have many ground pads some or all of which may be connected to a ground bus partially or completely encircling the die in the interconnect area. Leads may also be connected to the bus as required. A second bus, a power bus for example, may be located adjacent to the ground bus and connected to power pads and to leads.

In one example, two buses have been provided on a ceramic chip carrier or die carrier with the buses and leads all formed in a single level of conductor. In this example the buses are parallel streets, located between the die and the leads, and separated laterally from each other, from the die, and from the leads. In this example the two buses increase the distance from pads to leads by the distance from the die side of the inner bus to the leads, that is to say by the width of the two buses and the width of the separation between the buses and by the width of the separation between bus and leads. FIG. 1 shows a portion of a prior art substrate 10 including a mounted die 11, bond pads 12 on die 11, a first bus 13, a second bus 14, and package leads 15. The buses 13 and 14 and leads 15 are all formed in one conductor level. The width of each bus is shown by the arrows 16. The leads 15 are moved outward from the die 11, by a distance shown by the arrow 17, to provide room for the buses. The arrow 17 extends from the edge 18 on the die side of the bus 13 to the end 15a of a lead 15. The conductors, such as bond wires 19, that connect pads 12 to leads 15, are longer by the amount shown by arrow 17 than they would be in the absence of buses. Other bond wires 19 are shown connecting, a pad 12 to the bus 14, a lead 15 to the bus 13, and a lead 15 to the bus 14, in accordance with the discussion above.

In another example, two buses have been provided in an integrated circuit package, one bus being in one conductor level and the other bus being in another conductor level. In this example the exposed areas of the buses are parallel streets, located between the die and the leads, and separated at least vertically from each other and laterally from the die and from the leads. In this example the buses increase the distance from pads to leads by the distance from the die side of the inner bus to the lead, that is to say by the width of the two buses and by the width of the separation between bus and leads.

It should be noted that each bus must be at least wide enough for wire or TAB or other suitable connection.

The addition of two buses around an integrated circuit die, as just described, has the following disadvantages.

The increased distance between pads and leads requires longer wire or TAB connections. The longer connections have larger inductance which causes stronger magnetic coupling and associated electrical noise. One particularly troublesome example of this, called "ground bounce", is associated with simultaneous switching of a number of output buffers, and is proportional to the total inductance present.

Longer wires, between pads and buses, or between pads and leads, are very fragile because the wires are typically only about 25 microns thick. These longer wires may easily be distorted from their initial position and cause failures by becoming open circuit or by shorting together. Costs are increased by these failures and reliability is decreased.

Also, the addition of two buses around an integrated circuit die consumes additional area and thereby increases cost.

A goal of the present invention is to provide two buses in a single level of conductor while minimizing the disadvantages described above.

SUMMARY OF THE INVENTION

The present invention provides a compact arrangement of two buses for use with an integrated circuit die. The buses are located in the interconnect area outside the die attach area and have a special geometry described as follows. The buses, formed in a single conductor level, are in the form of two opposing combs, with each comb having a ribbon portion and fingers extending from the ribbon portion, and with the fingers of one comb located between the fingers of the other comb in a so-called interdigitated configuration. The first bus, located closest to the integrated circuit die, includes a ribbon portion close to the die with attached fingers pointing away from the die towards the second bus. The second bus, includes a ribbon portion having fingers attached, the fingers pointing towards the integrated circuit die and falling between the oppositely pointing fingers of the first bus. Pads and leads may be connected to the fingers by wire bonding or by other conventional means. The ribbon portion connects the fingers together to provide electrical continuity. One die design may be replaced by another having different pad numbers assigned to a given fixed voltage merely by altering the list of pads to be connected to fingers on the appropriate bus.

The width of two comb buses can be compared to the width of two street buses as follows. The minimum width of either type of bus is the same and is that required to accommodate wire connections or TAB connections or other appropriate connections. The sum of the widths of two comb buses in interdigitated configuration is, however, less than the sum of the widths of two street buses. The difference is equal to the difference between a street bus and the ribbon portion of a comb bus. The ribbon portion of a comb bus does not have to accommodate wire or TAB or other connections and is therefore narrower than a street bus.

When two comb buses replace two street buses between the die and the leads, the connection distances between lead and pad, between lead and inner bus and between pad and outer bus are all reduced by an amount equal to the change in width of the two buses.

When two comb buses replace two street buses with the leads between the die and the buses, in an arrangement yet to be described, the connection distances between the outer bus and leads and between outer bus and pads are reduced by an amount equal to the change in the width of two buses.

Thus, when interdigitated comb buses replace street buses, the length of connections is reduced and associated inductance and electromagnetic coupling and ground bounce are reduced. Costs are reduced by reducing the area occupied by a die and its connections and by reducing the number of defective connections.

BRIEF DESCRIPTION OF THE DRAWINGS

FIG. 3B shows a cross section taken at 3B—3B of FIG. 3A

FIG. 3C shows a cross section taken at 3C—3C of FIG. 3A.

DETAILED DESCRIPTION OF THE INVENTION

Figure 1:
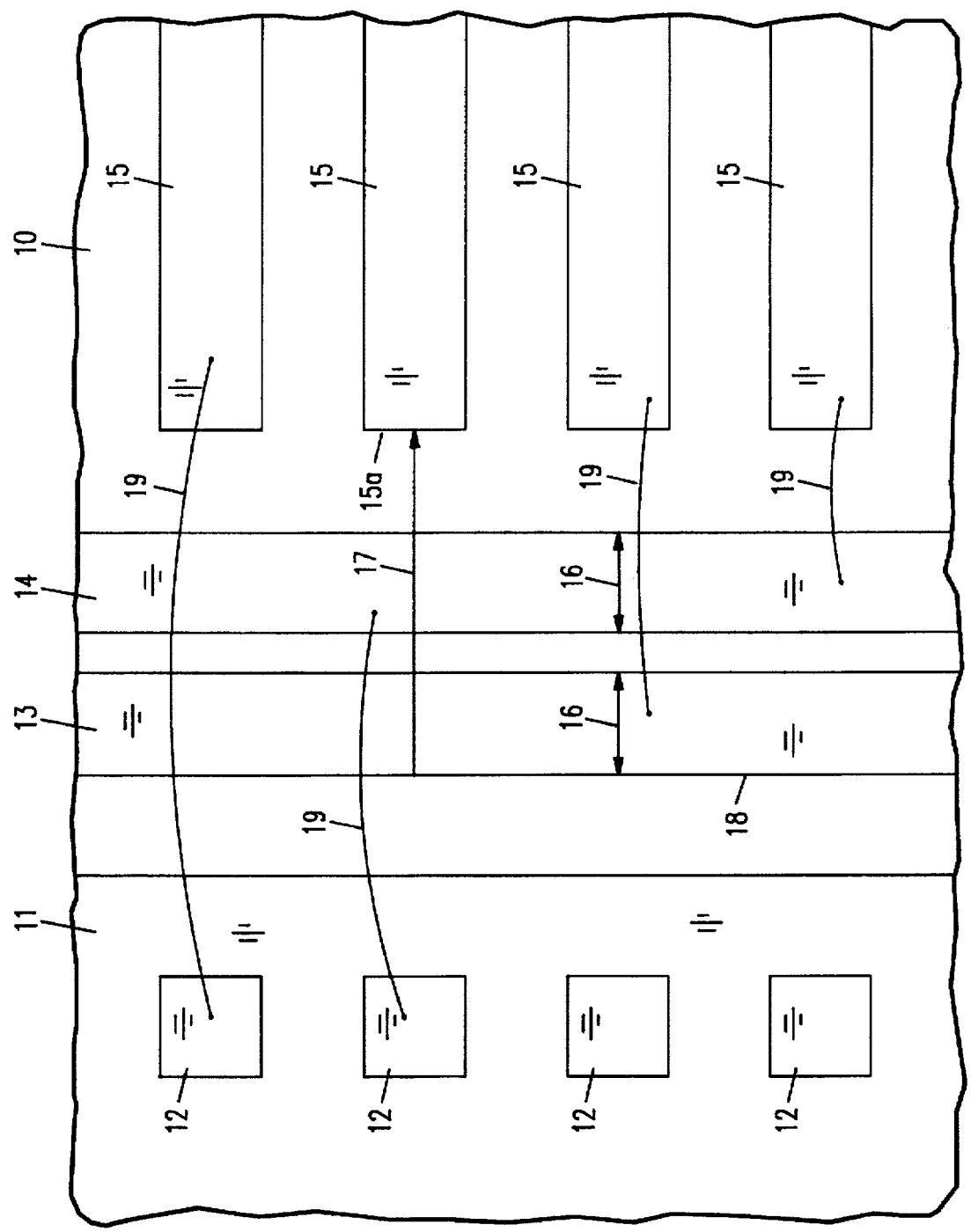
FIG. 1 shows, in plan outline, a portion of a substrate having two buses and leads in a single conductor level, according to the prior art.
Figure 2:
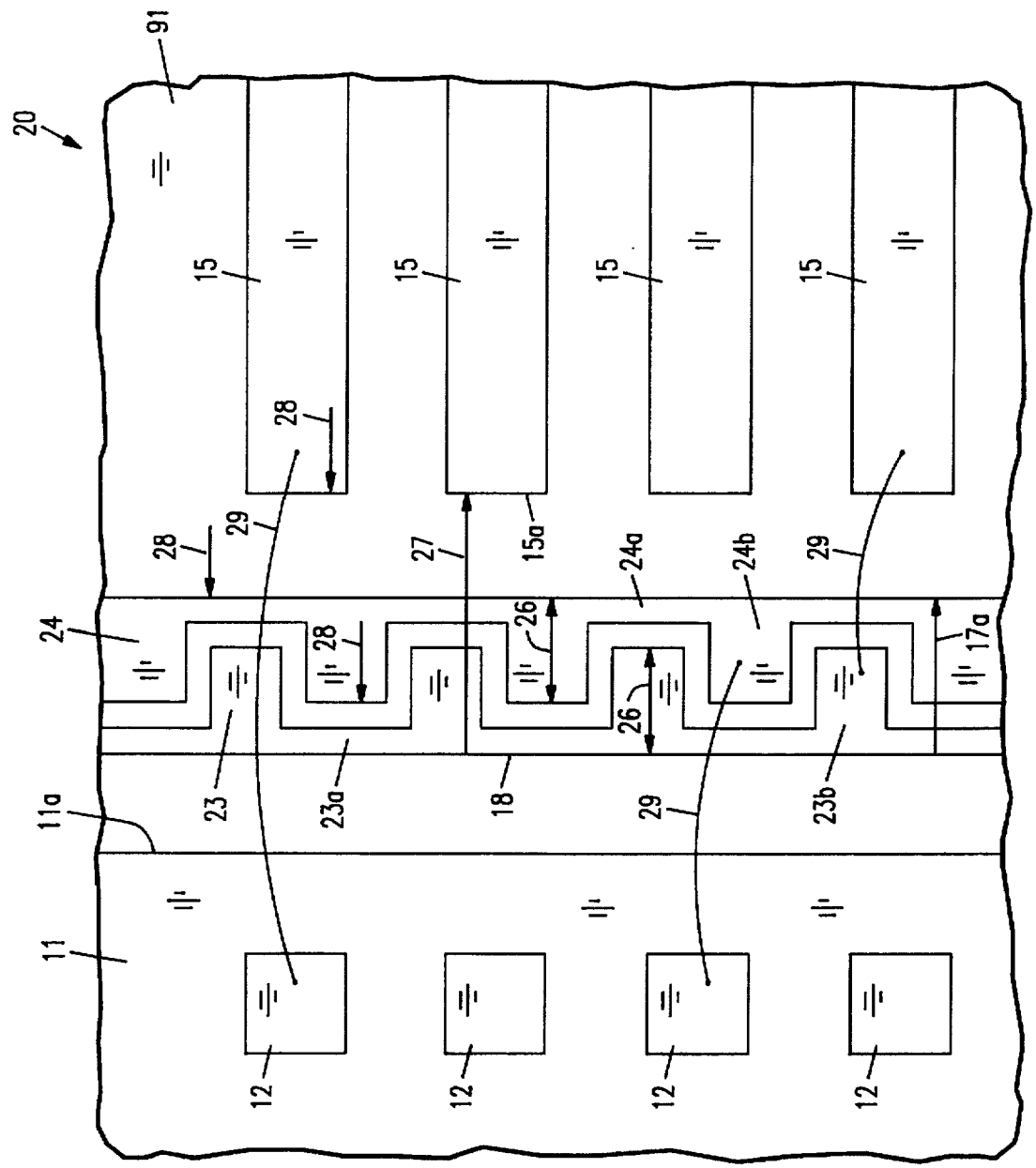
FIG. 2 shows, in plan outline, a portion of a substrate having two interdigitated comb buses and leads in a single conductor level, in accordance with the present invention.

FIG. 2 shows a portion of an integrated circuit assembly 20 in accordance with the present invention. The assembly 20 includes an insulative substrate 91, an integrated circuit die 11, mounted thereon and having a peripheral edge 11a, bond pads 12 adjacent to the edge of the die 11, a first comb bus 23 on the substrate 91, a second comb bus 24 on the substrate 91 interdigitated with the first bus 23, and leads 15 on the substrate 91. The buses and leads are all formed in a single conductor level deposited on or laminated to the substrate and etched or patterned, all by conventional methods. The interdigitated fingers 23b and 24b of the combs extend laterally from strips 23a and 24a respectively. The width of each bus is shown by the arrows 26. The leads 15 are moved outward from the die 11, by a distance shown by the arrow 27, to provide room for the buses. The conductors, such as bond wires 29, that connect bond pads 12 to leads 15 are longer by the length of arrow 27 than they would be without buses. In FIG. 2, the arrow 27 extends from the edge 18 on the die side of the bus 23 to the end 15a of a lead 15. The arrow 27 in FIG. 2 is shorter than the arrow 17 in FIG. 1 by the length of arrow 28. The arrows 28 show how far certain features, for example, the end 15a of leads 15, are displaced back toward the die from the positions of the same features in FIG. 1, as a result of changing from street buses of FIG. 1 to the interdigitated comb buses of FIG. 2. The bond wires 29 that connect pads 12 to leads 15, pads 12 to bus 24, and bus 23 to leads 15 are all shorter in FIG. 2, by the length of arrow 28, than they are in FIG. 1.

Figure 3A:
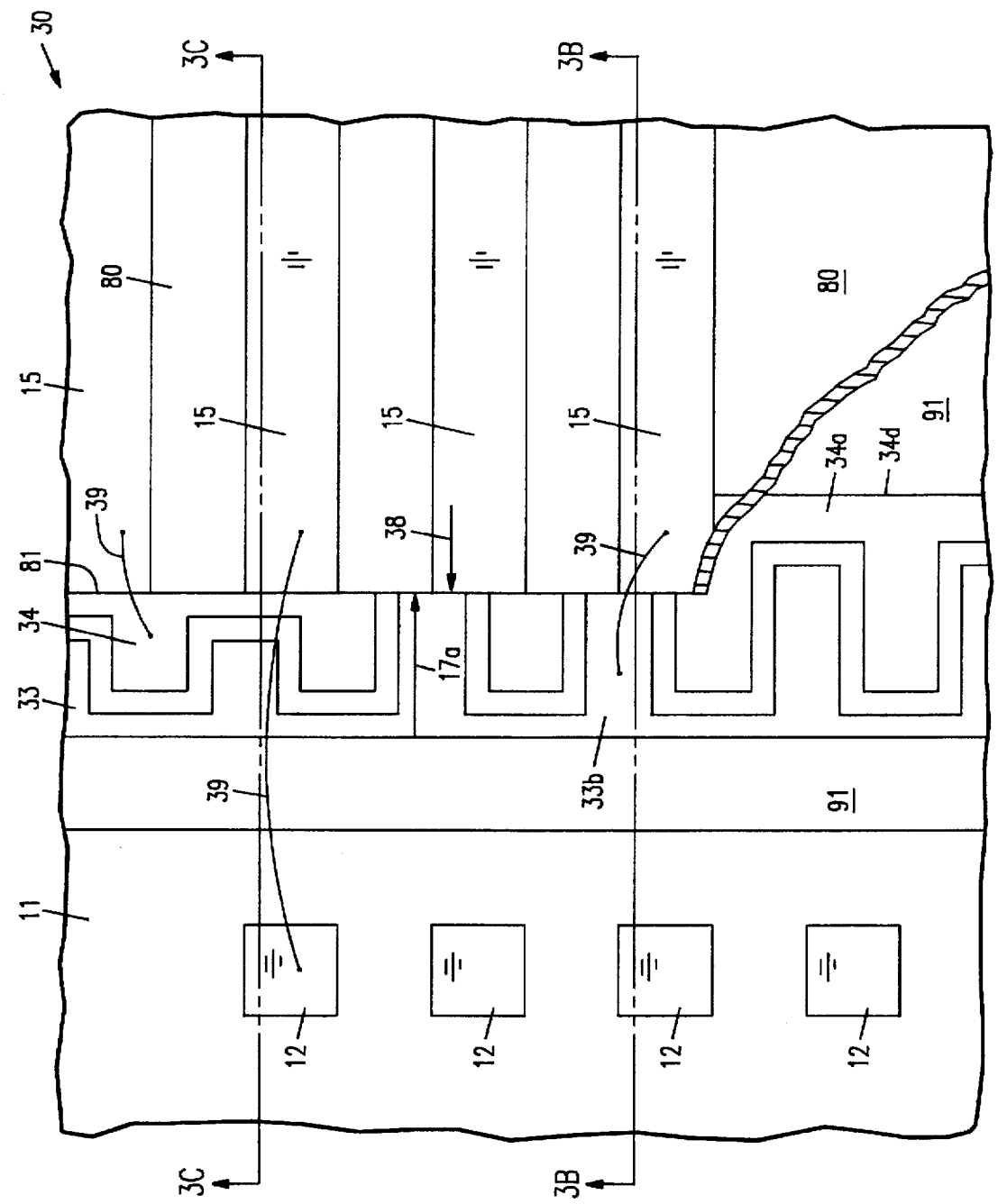
FIG. 3A shows, in plan outline, a portion of an integrated circuit assembly having two conductor levels and having interdigitated comb buses in accordance with the present invention.

FIG. 3A shows a portion of an integrated circuit assembly 30 in accordance with the present invention. FIGS. 3B and 3C show cross sections taken at 3B—3B and at 3C—3C, respectively. The assembly 30 includes a substrate-mounted die 11 on substrate 91, bond pads 12 adjacent a die peripheral edge 11a, a first comb bus 33, a second comb bus 34, and leads 15. The buses 33 and 34 are in a first level of conductor 92 on the substrate 91. A first level of insulator 80 extends from line 81 over the entire area to the right of line 81. The first level of insulator 80 is absent to the left of line 81 and is shown cut away for clarity in the lower right portion of FIG. 3A. The first level of insulator 80 is above the first level of conductor 92 and below a second level of conductor 93. The leads 15 are in the second level of conductor 93 and overlie the first level of insulator 80. In FIGS. 3A, 3B and 3C, the leads 15 are not laterally separated from buses 33 and 34. They are vertically separated from buses 33 and 34 by first insulator level 80. This configuration (buses in a first conductor level and leads in a second conductor level) allows closer spacing of the leads 15 to the pads 12. The insulator 80 overlies the strip 34a and a portion of finger 33b in the cross section shown in FIG. 3B. It should be noted that the spacing of leads to pads shown in FIG. 3A can be maintained without having the leads 15 or first insulator 80 overlying any portion of the buses 33 and 34. Such is the case where the ribbon portion 34a of bus 34 is outside the area covered by first insulator level 80, as shown in the upper portion of FIG. 3A and in FIG. 3C. On the other hand, the buses may be extended to any required distance to the right of line 81 under insulator 80, as shown in the lower portion of FIG. 3A, i.e. the edge 34d of bus 34 may be moved further to the right. The width 17a of the exposed portions of the two buses to the left of line 81 in FIGS. 3A, 3B and 3C is the same as the width 17a of the two buses in FIG. 2.

The extent to which the use of a second level of conductor allows the ends of the leads to be moved from their former positions in FIG. 2 closer to the pads 12 is shown in FIG. 3A by the arrows 38. The distances between leads 15 and bus 34, between leads 15 and bus 33, and between leads 15 and pads 12 are also reduced by the distance represented by arrow 38. The lengths of conductors, such as bond wires 39, required to connect leads 15 to bus 34, leads 15 to bus 33, and leads 15 to pads 12 are also reduced by that amount, i.e. the length of arrow 38. These reductions in conductor lengths are cumulative with those discussed in regard to FIG. 2, i.e. the bond wire 39 connecting a lead 15 to a pad 12 and the bond wire 39 connecting a lead 15 to the bus 33 are shorter in FIG. 3A than in FIG. 1 by an amount equal to the sum of the lengths of the arrow 28 in FIG. 2 and the arrow 38 in FIG. 3.

The leads 15 may be laterally separated from buses 33 an 34 in FIG. 3 at the cost of moving the leads 15 further away from the pads 12.

Plated vias or filled vias may be used to connect the two levels of conductor shown in FIGS. 3A, 3B and 3C to other conductor levels not shown.

Figure 4:
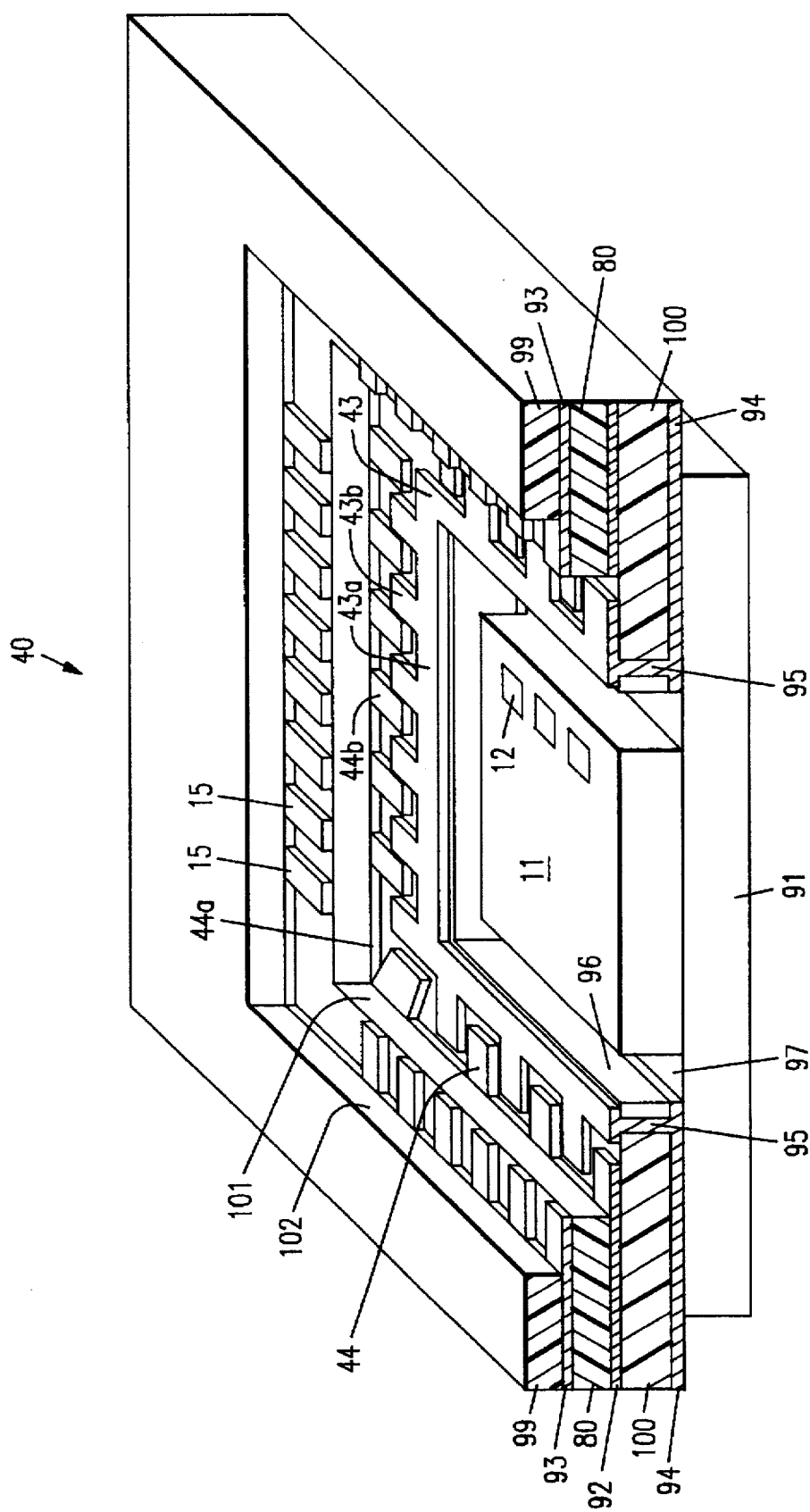
FIG. 4 shows a schematic perspective and section view of an integrated circuit package in accordance with the present invention.

FIG. 4 shows a perspective view and section of portion 40 of an integrated circuit package. The embodiment shown in FIG. 4 is similar to that shown in plan outline in FIG. 3A (i.e. the buses are in one conductor level and the leads are in another conductor level). The portion 40 includes die 11 attached to a substrate 91, bond pads 12 on the die, a first comb bus 43, a second comb bus 44, and leads 15. The buses 43 and 44 are in a first level of conductor 92. A first level of insulator 80 lies on top of the first level of conductor 92. The leads 15 are in a second level of conductor 93 on top of the first level of insulator 80. An opening 102, in second insulator level 99, exposes portions of the leads 15. The first level of insulator 80 overlies portions of the bus 44 (i.e. strip 44a which connects fingers 44b together). This embodiment can be modified so that the fingers 43b of bus 43 are also partly overlaid by first insulator level 80 (as in the lower part of FIG. 3A). In FIG. 4, the leads 15 are vertically separated but not laterally separated from bus 44 by the first insulator level 80. The outer boundary 44d of bus 44 can be moved out from under insulator 80 so that the insulator 80 and leads 15 do not overlay any part of the buses (as in the upper part of FIG. 3A and in FIG. 3C). The width of the exposed portions of buses 43 and 44 (strip 43a and interdigitated fingers 43b and 44b, exposed by an opening 101 in the insulator 80) must be at least sufficient to receive wire bond or other connections. A third conductor level 94 and a third insultator level 100 are shown in FIG. 4. Plated or other vias 95 are shown connecting bus 43 to third conductor level 94. Additional conductor levels can be added to the structure. Buses 43 and 44 can be connected by conductive vias to these other conductor levels as appropriate. The buses substantially circle the die attach area 97 although for clarity, only three sides of the buses are shown around die 11.

In another embodiment, not shown, the structure is similar to that shown in FIG. 4 except that the positions of buses and leads are reversed, the leads being in the first conductor level 92 rather than in the second conductor level 93 and the exposed portions of the leads being between the buses and the die.

In another embodiment, not shown, two interdigitated comb buses may be implemented in one conductor level and an additional two interdigitated comb buses may be implemented in another conductor level so that a die attach area is partly or completely encircled by these four buses.

A bus may be at any voltage required. Two buses in a pair may be at different voltages or at the same voltage. For example, many high speed circuits have a "clean" power for the core circuitry and a "dirty" or "noisy" power for the input/output circuitry. Likewise, in a pair of interdigitated buses, one may be for "clean" ground and the other for "dirty" ground.

It is evident that other embodiments are within the scope of the present invention. Any number of conductor levels may be used. Additional conductor levels may exist above or below a conductor level or levels containing the buses. Either one or both of the buses may be extended to form a ground or power plane. Either one or both of the buses may be connected by vias to other conductor levels. The bus closest to the die may be an extension of a conductive layer covering the die attach area. These and other variations are intended to be encompassed by the appended claims.

We claim:

1. An integrated circuit package comprising:

a die attach area;

a first bus including a first strip formed in a first conductor level and substantially encircling said die attach area, said first bus further including fingers formed in said first conductor level and integrally attached to said first strip and pointing from said first strip away from said die attach area, said first bus being for a first electrical potential; and a second bus including a second strip formed in said first conductor level and substantially encircling said first bus, said second bus further including fingers formed in said first conductor level and integrally attached to said second strip and pointing from said second strip toward said first bus, said second bus being for a second electrical potential, said fingers of said first bus being located between and alternating with said fingers of said second bus, wherein said first electric potential is equal to said second electric potential.

2. The package of claim 1 further comprising:

a second conductor level; and vias, and wherein said first bus is connected by said vias to said second conductor level.

3. The package of claim 1 further including an integrated circuit die attached to said die attach area, said die having a series of bonding pads thereon and wherein bonding wires connect selected ones of said pads to respective ones of said first bus fingers and second bus fingers.

4. An integrated circuit device comprising:

an insulator substrate having metallization thereon;

an integrated circuit die having bonding pads thereon, said die being bonded to said substrate;

a first insulator level bonded to said substrate; portions of a conductive layer attached to said first insulator level;

first and second conductive buses on said first insulator level and surrounding said die;

one of said buses being a power bus and the other of said buses being a ground bus;

each of said buses having a strip in said conductive layer and having a series of fingers in said conductive layer, said fingers being attached to said strip; and wherein said fingers of one bus are spacedly interdigitated with said fingers of the other bus.

5. The integrated circuit device of claim 4 further comprising:

vias connecting at least one of said buses to said metallization on said insulator substrate.

6. The integrated circuit device of claim 4, further comprising:

a second insulator level bonded to said first insulator level; and conductive leads on said second insulator level.

* * * * *